(12) United States Patent
Jee et al.

(10) Patent No.: US 7,888,204 B2
(45) Date of Patent: Feb. 15, 2011

(54) METHOD OF FORMING NONVOLATILE MEMORY DEVICE HAVING FLOATING GATE AND RELATED DEVICE

(75) Inventors: Jung-Geun Jee, Seoul (KR); Ho-Min Son, Suwon-si (KR); Yong-Woo Hyung, Yongin-si (KR); Jae-Jong Han, Seoul (KR); Taek-Jin Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 84 days.

(21) Appl. No.: 12/228,772

(22) Filed: Aug. 15, 2008

(65) Prior Publication Data

US 2009/0108323 A1 Apr. 30, 2009

(30) Foreign Application Priority Data

Aug. 16, 2007 (KR) ...................... 10-2007-0082327

(51) Int. Cl.
*H01L 21/336* (2006.01)
(52) U.S. Cl. ................ 438/257; 438/266; 257/E21.304
(58) Field of Classification Search ................ 438/257, 438/266, 259, 263, 264; 257/E21.304
See application file for complete search history.

(56) References Cited

U.S. PATENT DOCUMENTS

| | | | |
|---|---|---|---|
| 6,462,374 B2 | 10/2002 | Usuki et al. | |
| 6,943,074 B2 | 9/2005 | Kamiya et al. | |
| 2002/0003255 A1 | 1/2002 | Usuki et al. | |
| 2003/0057473 A1 | 3/2003 | Kamiya et al. | |
| 2006/0258076 A1* | 11/2006 | Mizushima et al. | 438/201 |

FOREIGN PATENT DOCUMENTS

| | | |
|---|---|---|
| JP | 09-036263 | 2/1997 |
| JP | 2000-311956 | 11/2000 |
| JP | 2002-16155 | 1/2002 |
| KR | 10-0373472 | 2/2003 |

* cited by examiner

*Primary Examiner*—Jack Chen
(74) *Attorney, Agent, or Firm*—Mills & Onello, LLP (57) ABSTRACT

A method of manufacturing a non-volatile memory device is provided. The method includes forming isolation patterns defining an active region on a substrate, forming a floating gate pattern on the active region, and forming a gate line on the floating gate pattern. The floating gate pattern is self-aligned on the active region and has an impurity ion concentration that becomes relatively low as the floating gate pattern gets nearer to the active region.

16 Claims, 7 Drawing Sheets

METHOD OF FORMING NONVOLATILE MEMORY DEVICE HAVING FLOATING GATE AND RELATED DEVICE

This application claims the benefit of Korean Patent Application No. 10-2007-0082327, filed Aug. 16, 2007, the contents of which are hereby incorporated herein by reference in their entirety.

BACKGROUND OF THE INVENTION

1. Field of the Invention

The present invention relates to semiconductor devices and manufacturing methods thereof, and more particularly, to a method of forming a non-volatile memory device having a floating gate and a related device.

2. Description of Related Art

Semiconductor memory devices can be divided into volatile memory devices and non-volatile memory devices. The non-volatile memory devices have characteristics of keeping data stored therein even though electric power is interrupted. Thus, the non-volatile memory devices have been widely adapted for mobile communication system, mobile memory devices, and auxiliary memory devices of various digital devices, and so on.

An example of the non-volatile memory devices is a flash memory device, a unit cell of the non-volatile memory device comprises an active region defined in a predetermined region of a semiconductor substrate, a tunnel dielectric layer formed on the active region, a floating gate formed on the tunnel dielectric layer, a gate inter-dielectric layer formed on the floating gate, and a control gate electrode formed on the gate inter-dielectric layer.

The floating gate acts as a charge storehouse. In this case, the floating gate is formed to have superior conductivity. For example, the floating gate can be formed of a polysilicon layer in which a high concentration of impurity ions is included. The high concentration of impurity ions acts to increase the conductivity of the floating gate.

A grain boundary is generally formed into the polysilicon layer. Further, the high concentration of impurity ions has a tendency to concentrate in the vicinity of the grain boundary, thereby degrading reliability of the tunnel dielectric layer. Meanwhile, in a case where the floating gate has a low concentration of impurity ions in order to overcome the aforementioned drawback, inferior characteristics can occur due to an increase in resistance of the floating gate.

A semiconductor device adapting a floating gate having double polysilicon layers is disclosed in U.S. Pat. No. 6,462,374, entitled "Semiconductor device and method for fabricating the same", by Usuki et al. However, the formation of such a device requires additional processing steps, i.e., to form two polysilicon layers as opposed to one.

SUMMARY OF THE INVENTION

According to the present invention provided is method of manufacturing a non-volatile memory device employing a floating gate having a low impurity ion concentration as the floating gate gets nearer to a tunnel dielectric layer, in order to avoid the aforementioned drawbacks of conventional approaches.

Also according to the present invention, there is provided a non-volatile memory device employing a floating gate having a low impurity ion concentration as the floating gate gets nearer to a tunnel dielectric layer.

In accordance with an aspect of the present invention, to achieve the aforementioned objects, the present invention provides a manufacturing method of non-volatile memory device. The method includes forming isolation patterns defining an active region on a substrate, forming a floating gate pattern on the active region and forming a gate line on the floating gate pattern. The floating gate pattern is self-aligned on the active region and is implanted with impurity ions having a concentration that decreases as the floating gate pattern gets nearer to the active region.

The isolation patterns can be formed to protrude upwardly from the active region.

Forming the floating gate pattern can include forming a first floating gate layer covering the isolation patterns and the active region. A screen layer can be formed on the first floating gate layer. A second floating gate layer can be formed on the screen layer. The floating gate pattern can be formed by planarizing the second floating gate layer, the screen layer and the first floating gate layer until the isolation patterns are exposed.

The first floating gate layer planarized can be formed to wrap sidewalls and a bottom of the second floating gate layer.

The first floating gate layer can be formed of an undoped polysilicon layer having a thickness in a range of about 5 to 40 nm (nanometers).

The screen layer can be formed to have a thickness in a range of about 0.1 through 3 nm.

The screen layer can be formed of at least one layer selected from a group consisting of a silicon oxide layer, a silicon nitride layer, a silicon oxy-nitride layer, and a combination thereof.

The screen layer can be formed by a plasma nitridation, a radical oxidation or a thermal oxidation process.

The second floating gate layer can be formed of an undoped polysilicon layer or a polysilicon layer that includes at least some of the impurity ions implanted therein.

The impurity ions can be implanted into the second floating gate layer and the first floating gate layer, after planarizing the second floating gate layer, the screen layer, and the first floating gate layer.

In this case, the impurity ions need not be implanted into a portion of the first floating gate layer adjacent to the active region.

Forming the isolation patterns can include forming a hard mask pattern on the substrate. Isolation trenches defining the active region can be formed on the substrate by using the hard mask pattern as an etching mask. An insulation layer filling the isolation trenches and covering the hard mask pattern can be formed. The hard mask pattern can be exposed by planarizing the insulating layer. Gate trenches and the isolation patterns can be formed by removing the hard mask pattern.

Further, the gate trenches can be extended by etching the isolation patterns after removing the hard mask pattern.

The impurity ions can be formed of ions selected from a group consisting of Boron, Phosphorus, Arsenic and Germanium.

A gate conducting layer can be formed for covering the floating gate pattern and the isolation patterns. The gate line can be formed by patterning the gate conducting layer.

Sidewalls of the floating gate pattern can be exposed by etching the isolation patterns before forming the gate conductive layer.

The gate line can cover the sidewalls and a top surface of the floating gate pattern and can be formed at a higher level than a bottom surface of the floating gate pattern.

In accordance with another aspect of the present invention provided is a non-volatile memory device. The non-volatile memory device comprises isolation patterns defining an active region on a substrate, a gate line traversing the active region and the isolation patterns, and a floating gate self-aligned on the gate line and the active region. The floating gate has an impurity ion concentration that decreases as it gets nearer to the active region.

The isolation patterns can protrude upwardly from the active region.

The floating gate can have a wider width than a top surface of the active region.

The floating gate can comprise a first floating gate pattern adjacent to the active region, a second floating gate pattern in which impurities are implanted, disposed on the first floating gate pattern, first floating gate patterns in which impurities are implanted, extending on the first floating gate pattern and covering sidewalls of the second floating gate pattern in which impurities are implanted, and a screen pattern disposed between the first floating gate pattern and the second floating gate pattern in which impurities are implanted.

The screen pattern can be extended between the second floating gate pattern in which impurities are implanted and the first floating gate patterns in which impurities are implanted.

The screen pattern can be a pattern selected from a group consisting of a silicon oxide layer, a silicon nitride layer, a silicon oxy-nitride layer, and a combination thereof.

The first floating gate pattern in which impurities are implanted can have a higher impurity ion concentration than the first floating gate pattern.

The second floating gate pattern in which impurities are implanted can have a higher impurity ion concentration than the first floating gate patterns in which impurities are implanted.

The first floating gate pattern need not have the impurity ions.

The first floating gate pattern can be an undoped polysilicon layer.

The gate line can cover sidewalls of the first floating gate pattern.

The gate line can cover the sidewalls and a top surface of the floating gate pattern and can be disposed at a higher level than a bottom surface of the floating gate pattern.

The impurity ions can be ions selected from a group consisting of Boron, Phosphorus, Arsenic and Germanium.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention.

DETAILED DESCRIPTION OF THE PREFERRED EMBODIMENTS

Hereinafter, aspects of the present invention will be described by explaining illustrative embodiments in accordance therewith, with reference to the attached drawings.

This invention can, however, be embodied in different forms and should not be construed as limited to the embodiments set forth herein. In the drawings, the thicknesses of layers and regions are exaggerated for clarity. The same reference numerals are used to denote the same elements. While describing these embodiments, detailed descriptions of well-known items, functions, or configurations are typically omitted for conciseness.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device can be otherwise oriented (e.g., rotated 90 degrees or at other orientations) and the spatially relative descriptors used herein interpreted accordingly.

Figure 1:
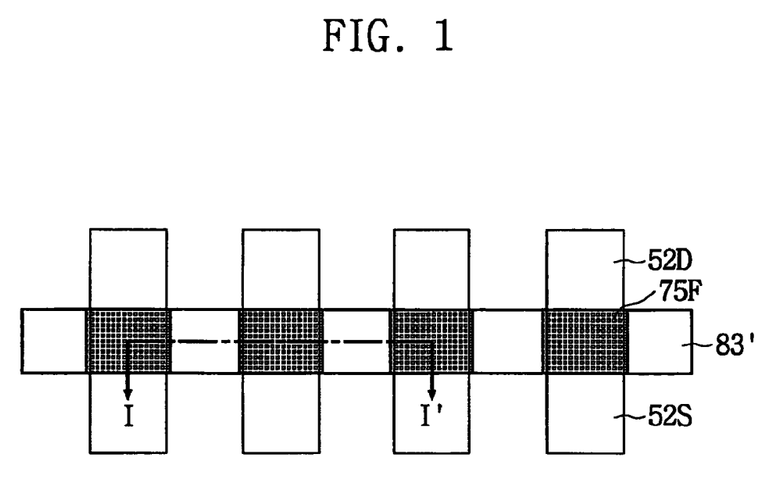
FIG. 1 is a plane view partially illustrating an exemplary embodiment of a flash memory device according to aspects of the present invention.

FIG. 1 is a plane view partially illustrating an exemplary embodiment of a flash memory device according to an aspect of the present invention, and FIGS. 2 through 13 are plane views taken along line I-I' of FIG. 1 used to describe a an embodiment of a method of manufacturing the flash memory device according aspects of the present invention.

Figure 2:
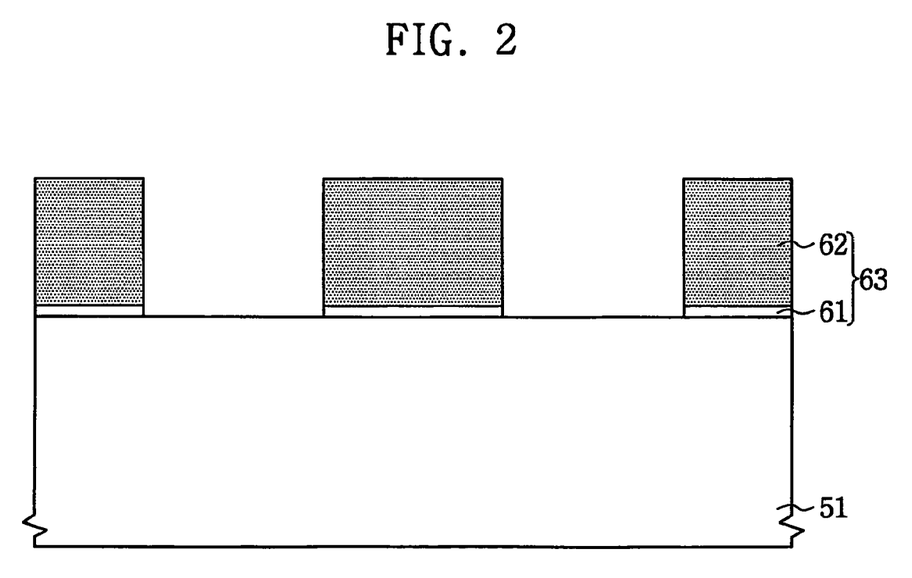
FIGS. 2 through 13 are cross-sectional views taken along the line I-I' of FIG. 1 for illustrating embodiments of manufacturing methods of a non-volatile memory device according to aspects of the present invention.

Referring to FIGS. 1 and 2, a hard mask pattern 63 can be formed on a substrate 51.

The substrate 51 can be a semiconductor wafer such as silicon wafer or a silicon-on-insulator (SOI) wafer, as examples. The hard mask pattern 63 can be formed by sequentially stacking a pad oxidation pattern 61 on the substrate 51 and then a nitride pattern 62 on the pad oxidation pattern 61. The pad oxidation pattern 61 can be formed of a thermal oxide layer or silicon oxide layer by a chemical vapor deposition (CVD) process. The nitride pattern 62 can be formed of a silicon nitride layer by a CVD process. The hard mask pattern 63 can be formed by using well-known photolithography and etching processes, as examples.

As illustrated, the pad oxidation pattern 61 can remain between the nitride pattern 62 and the substrate 51. Consequently, the pad oxidation pattern 61 can act to mitigate any stress between the nitride pattern 62 and the substrate 51.

Figure 3:
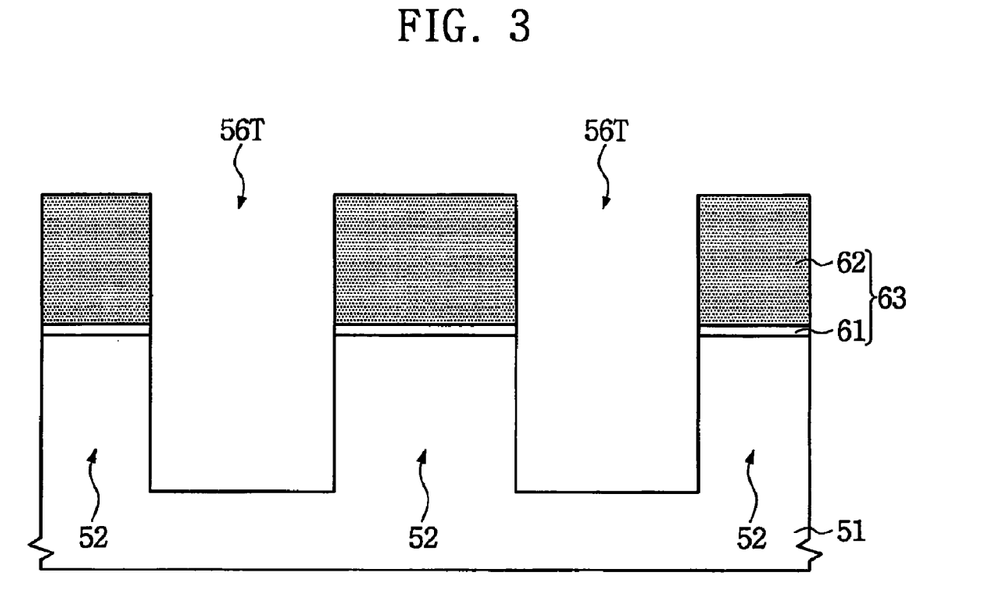

Referring to FIGS. 1 and 3, isolation trenches 56T can be formed into the substrate 51 to define active regions 52. The active regions 52 can be formed to have various shapes, such as a line shape and a bar shape, respectively. Further, the active regions 52 can be formed to be parallel to each other.

The process of forming the isolation trenches 56T can include an anisotropic etching process using the hard mask pattern 63 as an etching mask. Here, the active regions 52 can be formed to have various shapes, such as a trapezoidal shape having a top side with a smaller width than a bottom side or a reverse trapezoidal shape having a top side with a larger width than a bottom side, as examples. However, in the illustrative embodiment described hereinafter the active region 52 has a top side with substantially the same width as a bottom side.

Figure 4:
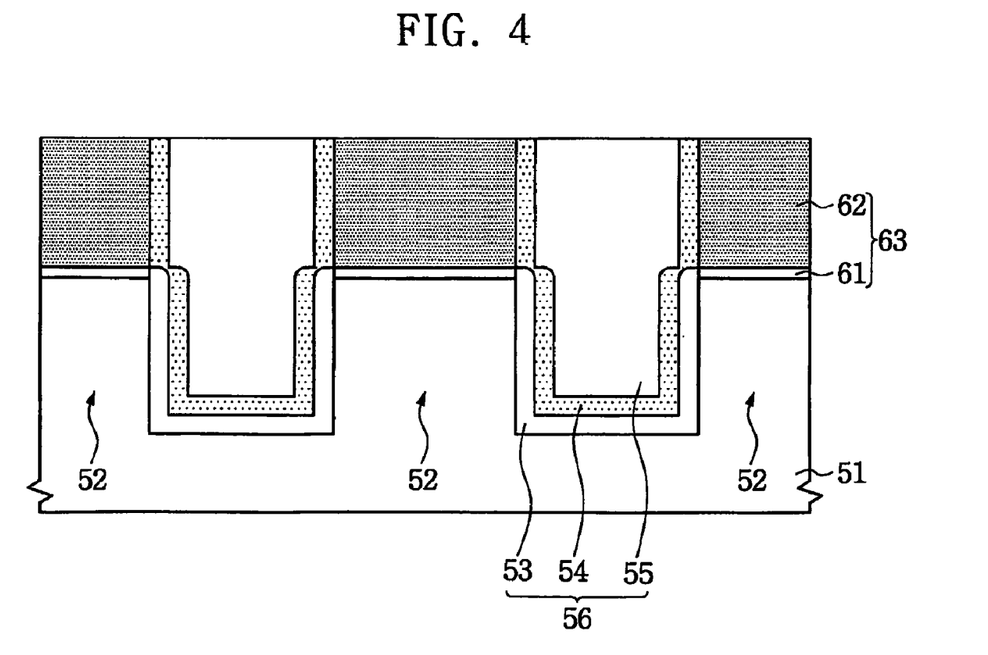

Referring to FIGS. 1 and 4, isolation patterns 56 can be formed in the isolation trenches 56T. The isolation patterns 56 can be formed of a sidewall oxide layer 53, a nitride layer liner 54, and an insulating layer such as a gap fill insulating layer 55, which are sequentially stacked.

Specifically, the sidewall oxide layer 53 can be formed in the isolation trenches 56T. The sidewall oxide layer 53 can be formed of a thermal oxide layer. Further, the sidewall oxide layer 53 can be formed to uniformly cover sidewalls of the active regions 52 exposed by the isolation trenches 56T. The nitride layer liner 54 can be formed on the sidewall oxide layer 53. The nitride layer liner 54 can be formed of a silicon nitride layer by means of the CVD process. The nitride layer liner 54 can be formed to uniformly cover the sidewall oxide layer 53 and the hard mask pattern 63. The gap fill insulating layer 55 can be formed on the nitride layer liner 54. The gap fill insulating layer 55 can be formed of a material having an etch selectivity with respect to the nitride pattern 62. For example, the gap fill insulating layer 55 can be formed of a silicon oxide layer, such as a high density plasma oxide layer or an SOG layer, as examples. The gap fill insulating layer 55 can be formed to cover the entire surface of the substrate 51 by completely filling in the isolation trenches 56T.

Next, the hard mask pattern 63 can be exposed by planarizing the gap fill insulating layer 55. In this case, the nitride layer liner 54 can remain in the isolation trenches 56T. The planarization of the gap fill insulating layer 55 can be performed by means of a chemical mechanical polishing (CMP) process or an etch-back process. However, the nitride layer liner 54 can remain on the hard mask pattern 63.

Consequently, a top surface of the isolation patterns 56 can be formed to have a higher level than the active regions 52. Further, the top surfaces of the isolation patterns 56 and the hard mask pattern 63 can be exposed on substantially the same plane.

Figure 5:
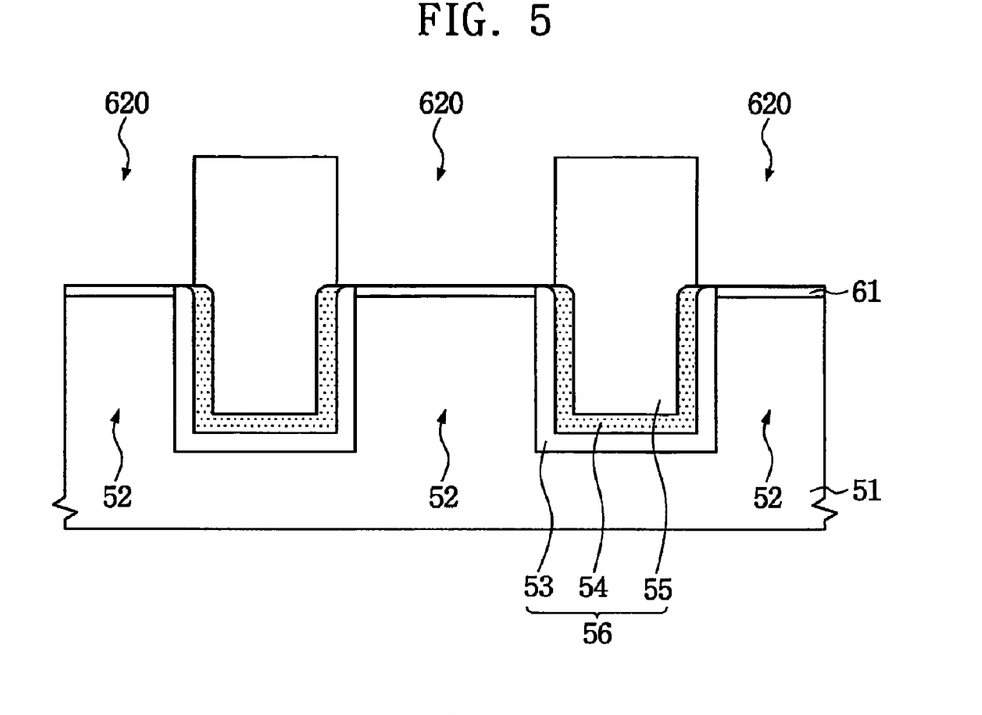

Referring to FIGS. 1 and 5, the pad oxide pattern 61 can be exposed by removing the nitride pattern 62. Accordingly, gate trenches 620 can be formed on the active regions 52. In this case, the gate trenches 620 can be self-aligned between the isolation patterns 56.

Removal of the nitride pattern 62 can be carried out by an isotropic etching process, such as wet etching using H3PO4, for example. During removal of the nitride pattern 62, the nitride layer liner 54 can also be partially etched. In this case, the nitride layer liner 54 can remain between the sidewall oxide layer 53 and the gap fill insulating layer 55.

Figure 6:
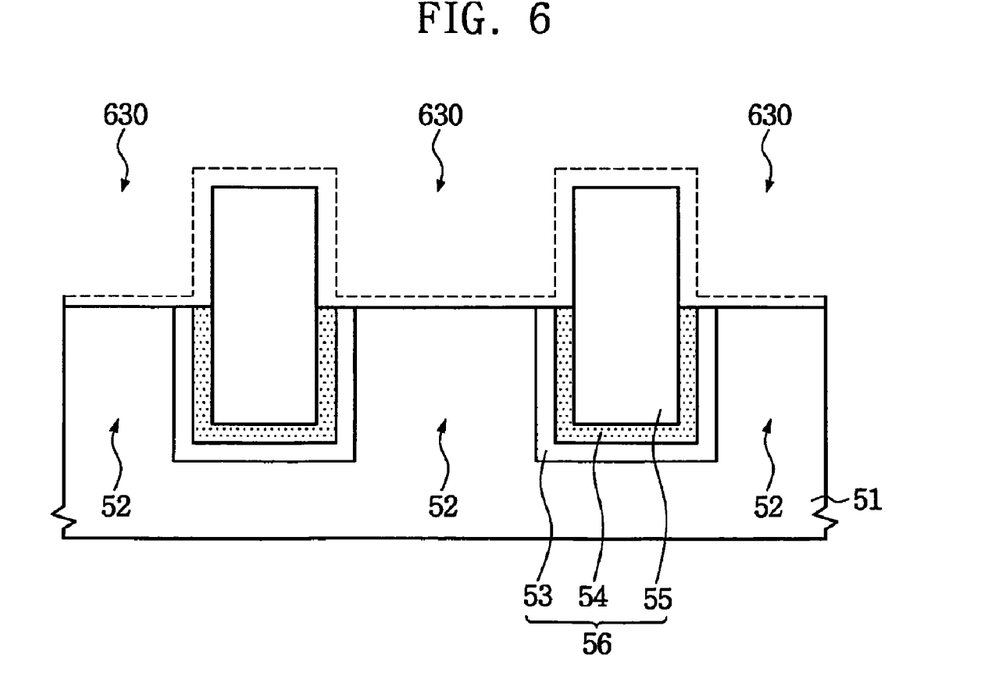

Referring to FIGS. 1 and 6, extended gate trenches 630 can be formed by removing the pad oxide pattern 61. Consequently, top surfaces of the active regions 52 can be exposed. Removal of the pad oxide pattern 61 can be carried out by an isotropic etching process, such as wet etching using HF. During removal of the pad oxide pattern 61, the gap fill insulating layer 55 can also be partially etched. In this case, the extended gate trenches 630 can be formed to have a greater width than the top surface of the active regions 52. Further, the extended gate trenches 630 can be significantly extended by isotropically etching the gap fill insulating layer 55.

Consequently, the extended gate trenches 630 can be self-aligned across the top surface of the active regions 52.

Figure 7:
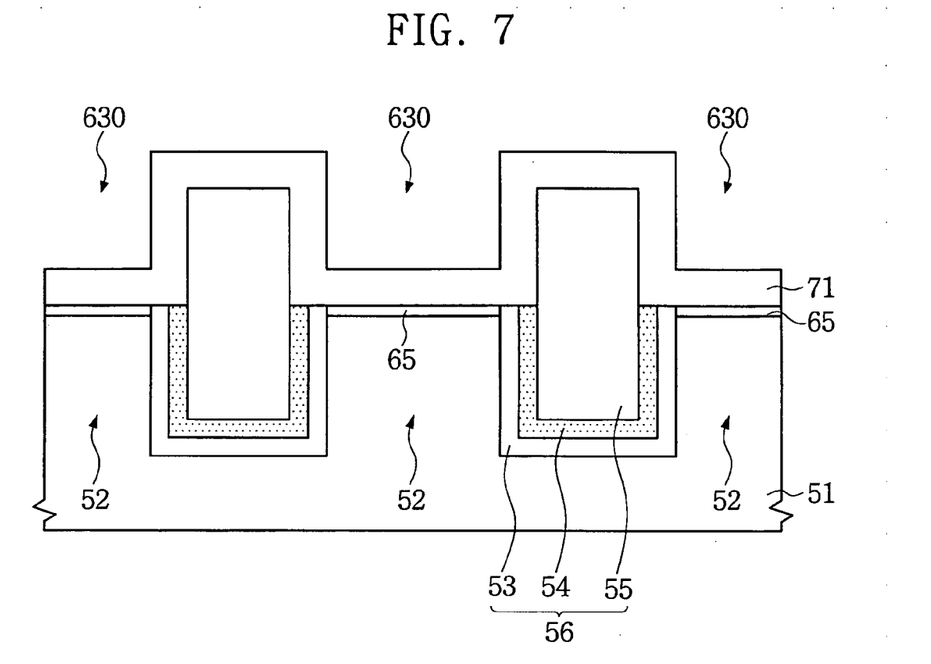

Referring to FIGS. 1 and 7, a tunnel dielectric layer 65 can be formed on the top exposed surface of the active regions 52. The tunnel dielectric layer 65 can be formed of a silicon oxide layer, such as a thermal oxide layer, for example. In other exemplary embodiments, the tunnel dielectric layer 65 can be formed of a silicon oxide layer, a high-K dielectric layer, a silicon nitride layer, a silicon oxynitride layer or a combination thereof, as other examples. The tunnel dielectric layer 65 can be formed by an atomic layer deposition or a chemical vapor deposition (CVD), as examples.

Next, a first floating gate layer 71 can be formed on the substrate 51. The first floating gate layer 71 can be formed of an undoped polysilicon layer. The first floating gate layer 71 can be formed to have a thickness in a range of about 5 to 40 nm (nanometers). Further, the first floating gate layer 71 can be formed to cover inner sidewalls of the extended gate trenches 630. In other words, the first floating gate layer 71 can cover sidewalls of the isolation patterns 56 and the tunnel dielectric layer 65. Further, the first floating gate layer 71 can contact the tunnel dielectric layer 65.

Figure 8:
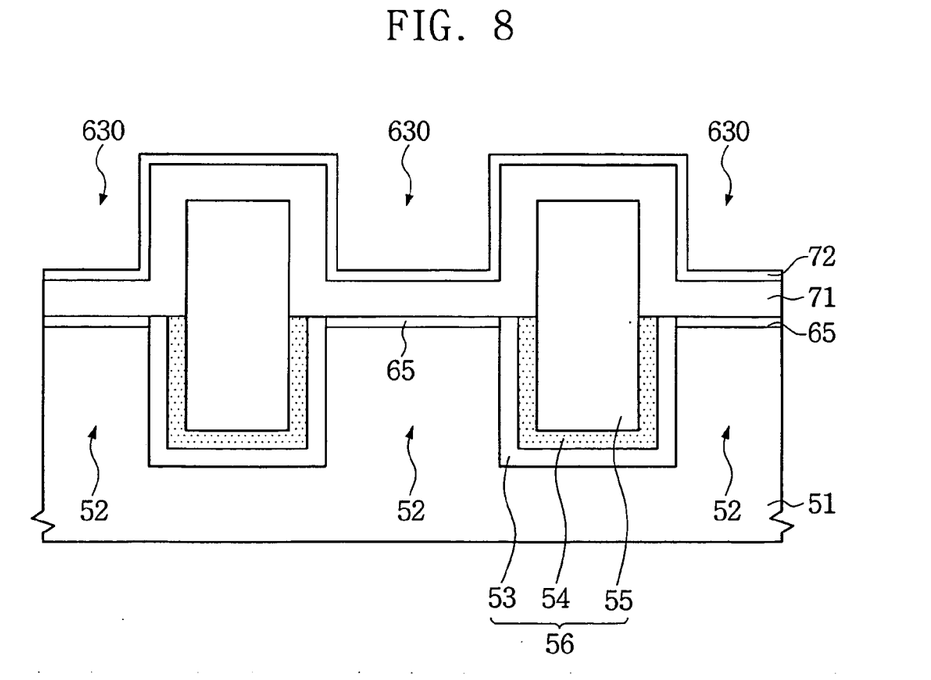

Referring to FIGS. 1 and 8, a screen layer 72 can be formed on the first floating gate layer 71. The screen layer 72 can be formed to have a thickness in a range of about 0.1 to 3 nm, more preferably to have a thickness in a range of about 1 to 2 nm. The screen layer 72 can be formed of one layer selected from a group consisting of a silicon oxide layer, a silicon nitride layer, a silicon oxy-nitride layer, and a combination thereof. The screen layer 72 can be carried out by a plasma nitridation, a radical oxidation or a thermal oxidation, as examples. The screen layer 72 can uniformly cover the top surface of the first floating gate layer 71.

Figure 9:
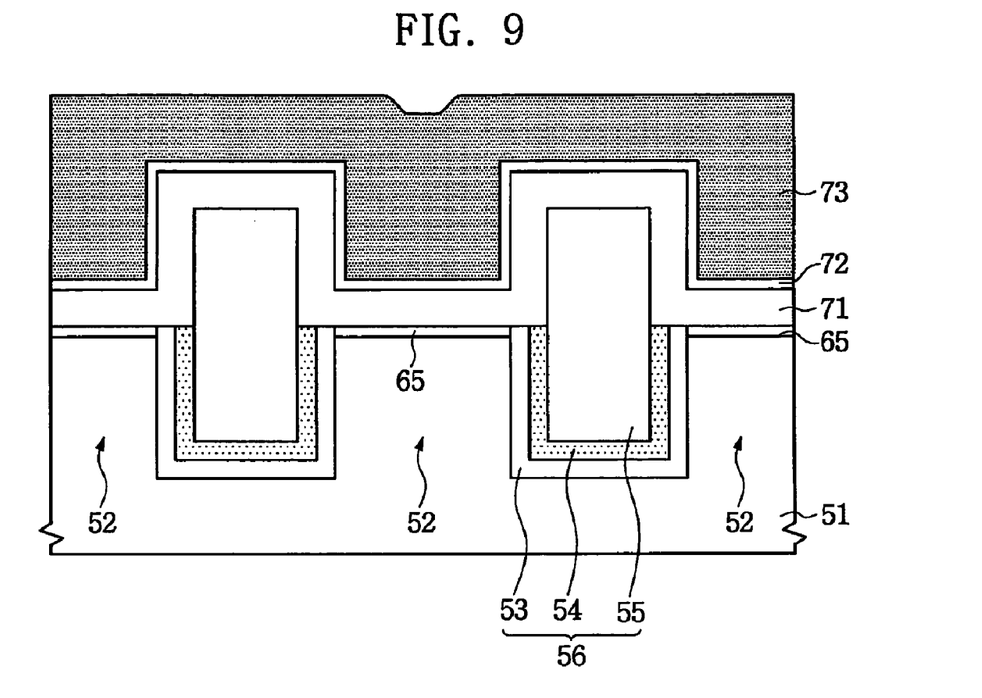

Referring to FIGS. 1 and 9, a second floating layer 73 can be formed on the screen layer 72. The second floating layer 73 can be formed to completely fill the extended gate trenches 630 and cover the substrate 51. The second floating layer 73 can be formed of either a doped polysilicon layer or a undoped polysilicon layer. The doped polysilicon layer can be formed of a polysilicon layer in which one element selected from a group consisting of Boron, Phosphorus, Arsenic and Germanium is added.

Figure 10:
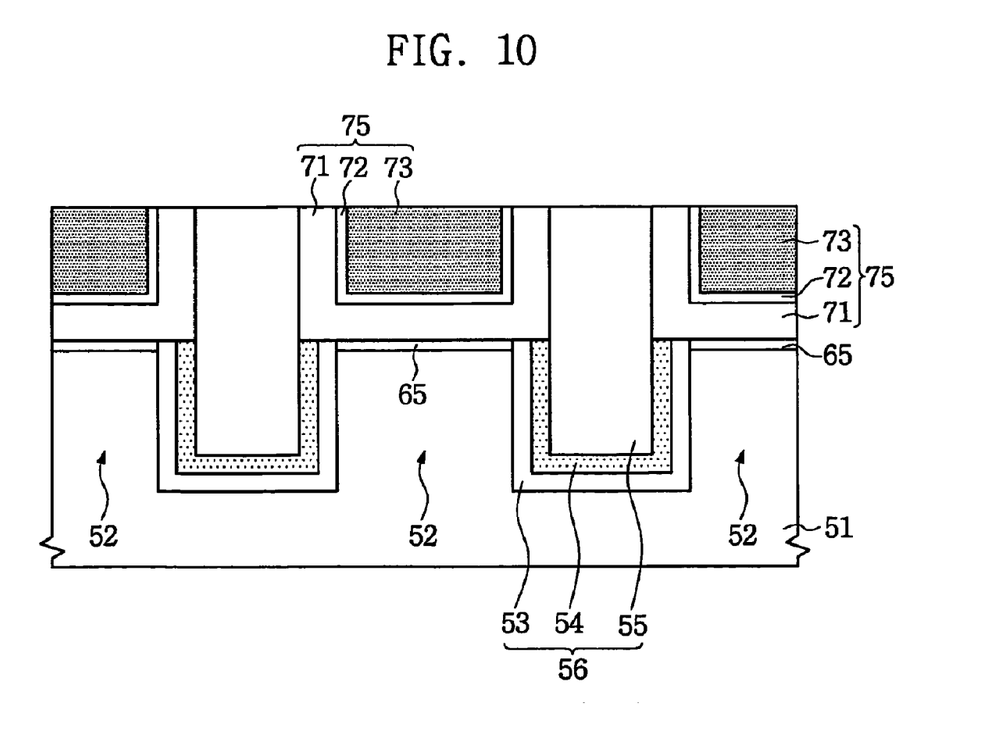

Referring to FIGS. 1 and 10, preliminary patterns 75 can be formed by planarizing the second floating layer 73, the screen layer 72 and the first floating gate layer 71 until exposing the isolation patterns 56. The planarizing of the second floating layer 73, the screen layer 72, and the first floating gate layer 71 can be carried out by a CMP process or an etch-back process.

Consequently, the preliminary patterns 75 can fill in the extended gate trenches 630. The preliminary patterns 75 can include the second floating layer 73, the first floating gate layer 71 covering the sidewalls and a bottom of the second floating layer 73, and the screen layer 72 interposed between the second floating layer 73 and the first floating gate layer 71, respectively. Further, the preliminary patterns 75 can be self-aligned across the top of the active region 52. The preliminary patterns 75 can be formed to have a wider width than the active region 52. Top surfaces of the isolation patterns 56 and the preliminary patterns 75 can be formed to be exposed on substantially the same plane. Further, the first floating gate layer 71 can be exposed between the second floating layer 73 and the isolation patterns 56.

Figure 11:
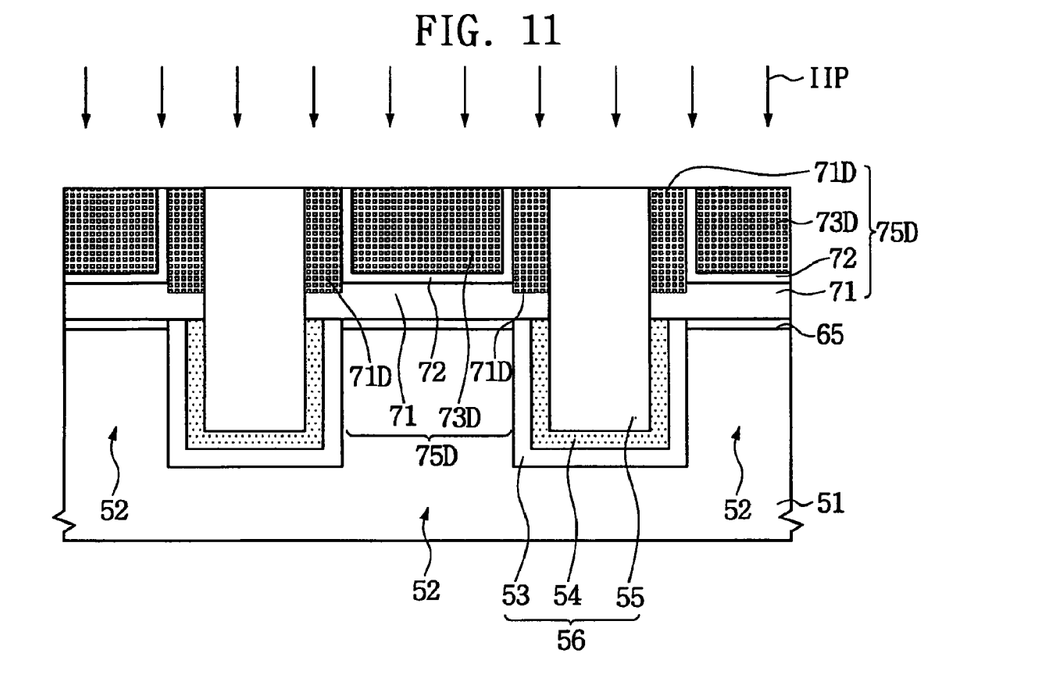

Referring to FIGS. 1 and 11, floating gate patterns 75D can be formed from the preliminary patterns 75 by implanting impurity ions therein using an ion implantation process (IIP). The impurity ions can be of a type selected from a group consisting of Boron, Phosphorus, Arsenic and Germanium.

The impurity ions can be implanted into the second floating layer 73 by the IIP. In this case, the second floating layer 73 can be completely converted to a second floating gate layer 73D in which impurity ions are implanted. Further, while carrying out the IIP, the impurity ions can be implanted into the first floating gate layer 71 through the exposed top surface thereof. In other words, first floating gate layers 71D in which impurity ions are implanted can be formed into both sides of the second floating layer 73. However, while carrying out the IIP, the screen layer 72 can act to prevent the impurity ions from being penetrated into portions of the first floating gate layer beneath the screen layer 72. Thus, the first floating gate layer 71 below the screen layer 72 can be maintained. In other words, the screen layer 72 provides control so that the impurity ions are not implanted into a region adjacent to the tunnel dielectric layer 65, or the first floating gate layer 71.

Consequently, the floating gate patterns 75D can include the second floating gate layer 73D in which impurity ions are implanted, the screen layer 72, the first floating gate layers 71D in which impurity ions are implanted, and the first floating gate layer 71 in which impurity ions are not implanted. The floating gate patterns 75D can have an impurity ion concentration which gets lower gradually from the top surface toward a lower region. Furthermore, the undoped polysilicon layer can be kept in the first floating gate layer 71 adjacent to the tunnel dielectric layer 65.

A concentration distribution of the impurity ions can get lower from the top surface of the floating gate patterns 75D downward. Specifically, the second floating gate layer 73D in which impurity ions are implanted can have a relatively higher concentration of impurity ions than the first floating gate layers 71D in which impurity ions are implanted. Further, the first floating gate layers 71D in which impurity ions are implanted can have relatively higher concentration of impurity ions than the first floating gate layer 71, which was covered by the screen layer 72. The screen layer 72 can act to interrupt the impurity ions from expanding. Thus, the first floating gate layer 71 adjacent to the tunnel dielectric layer 65 may not have the impurity ions or may have a relatively low concentration of impurity ions.

Figure 12:
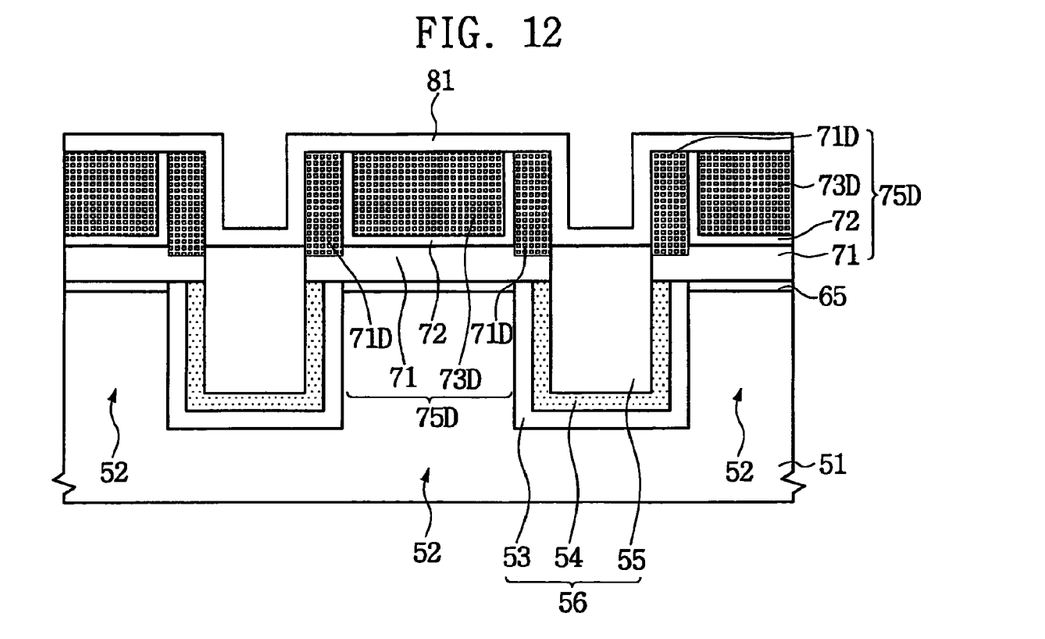

Referring to FIGS. 1 and 12, the isolation patterns 56 can be downwardly recessed from the top surfaces of the floating gate patterns 75D by carrying out an etch-back process. The top surfaces of the isolation patterns 56 having been recessed can be formed at a higher level than the active regions 52. In this case, sidewalls of the floating gate patterns 75D can be partially exposed. In other words, the first floating gate layers 71D in which impurity ions are implanted can be exposed over the recessed isolation patterns 56.

Next, an intergate dielectric layer 81 can be formed on the floating gate patterns 75D and the recessed isolation patterns 56. The intergate dielectric layer 81 can be formed of a silicon oxide layer, a silicon nitride layer, a silicon oxynitride layer, a high-k dielectric layer, or a combination thereof. For example, the intergate dielectric layer 81 can be formed of an oxide nitride oxide (ONO) layer. The ONO layer is formed of layers of a silicon oxide layer, a silicon nitride layer, and a silicon oxide layer, which are sequentially stacked. The intergate dielectric layer 81 can substantially uniformly cover exposed surfaces of the recessed isolation patterns 56 and the floating gate patterns 75D.

Figure 13:
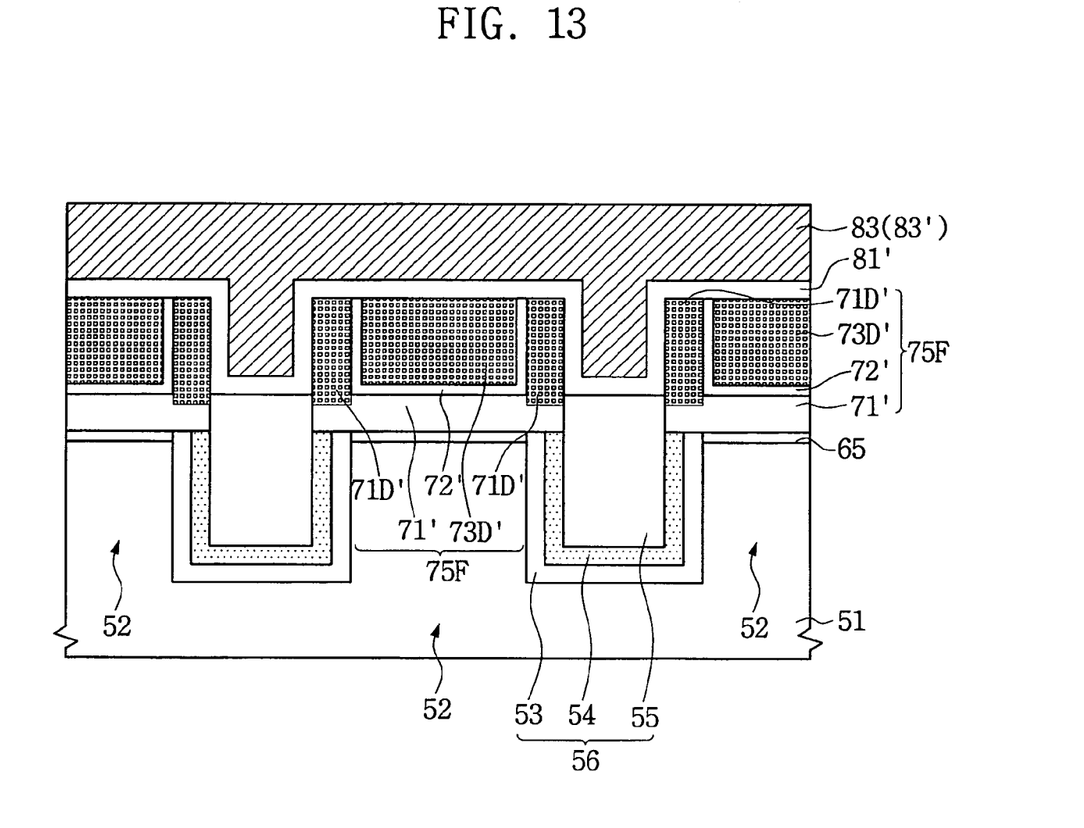

Referring to FIGS. 1 and 13, a gate-conducting layer 83 can be formed on the intergate dielectric layer 81. The gate-conducting layer 83 can be formed of a doped polysilicon layer, a metal layer, a metallic silicide layer, or a combination thereof.

A gate line 83', an intergate dielectric pattern 81' and floating gates 75F can be formed by consecutively patterning the gate-conducting layer 83, the intergate dielectric layer 81, and the floating gate patterns 75D. The gate line 83' can be formed to traverse the active region 52 and the isolation patterns 56. The gate line 83' can act as a control gate electrode. Further, the gate line 83' can partially cover sidewalls of the floating gates 75F.

The floating gates 75F can include a second floating gate pattern 73D', a screen pattern 72', first floating gate patterns 71D' in which impurities are implanted, and a first floating gate pattern 71'. The gate line 83' can partially cover sidewalls of the first floating gate patterns 71D' in which impurities are implanted.

Next, a flash memory device can be manufactured by using the proceeding processes, such as a process of forming source/drain regions 52S and 52D in the active region 52 adjacent to both sides of the gate line 83'.

Referring again to FIGS. 1 and 13, an exemplary embodiment of a flash memory device according to aspects of the present invention will be illustrated.

Referring again to FIGS. 1 and 13, an exemplary embodiment of a flash memory device according to aspects of the present invention can include isolation patterns 56 defining active regions 52 on a substrate 51. The active regions 52 can be formed to have various shapes, such as a line shape and a bar shape, respectively. Further, the active regions 52 can be formed to be parallel to each other.

The substrate 51 can be a semiconductor wafer, such as a silicon wafer or a silicon-on-insulator (SOI) wafer. The isolation patterns 56 can be formed of a sidewall oxide layer 53, a nitride layer liner 54, and a gap fill insulating layer 55, which are sequentially stacked. The nitride layer liner 54 can be formed so that the nitride layer liner 54 completely wraps sidewalls and bottom of the gap fill insulating layer 55. Further, the sidewall oxide layer 53 can be formed so as to completely wrap sidewalls and a bottom of the nitride layer liner 54. In other words, the nitride layer liner 54 can be interposed between the sidewall oxide layer 53 and the gap fill insulating layer 55. Further, the sidewall oxide layer 53 can cover sidewalls of the active regions 52.

The gate line 83' traversing the active regions 52 and the isolation patterns 56 can be provided. Floating gates 75F can be formed between the gate line 83' and the active regions 52. The floating gates 75F can be formed to be apart from each other, respectively. The floating gates 75F can be self-aligned with the active regions 52. The floating gates 75F can have a greater width than the active regions 52. A tunnel dielectric layer 65 can be interposed between the floating gates 75F and the active regions 52.

The intergate dielectric pattern 81' can be interposed between the gate line 83' and the floating gates 75F. The gate line 83' can be extended to cover sidewalls of the floating gates 75F. In this case, the gate line 83' and the isolation patterns 56 can face each other. The intergate dielectric pattern 81' can be extended between the gate line 83' and the isolation patterns 56.

The gate line 83' can be a doped polysilicon layer, a metal layer, a metallic silicide layer or a combination thereof, as examples. The tunnel dielectric layer 65 can be a silicon oxide layer, a high-K dielectric layer, a silicon nitride layer, a silicon oxy-nitride layer, and a combination thereof, as examples.

The floating gates 75F can include a first floating gate pattern 71', first floating gate patterns 71D' in which impurities are implanted, a screen pattern 72' and a second floating gate pattern 73D' in which impurities are implanted. The screen pattern 72' can be formed to wrap sidewalls and the bottom of the second floating gate pattern 73D' in which impurities are implanted. The first floating gate pattern 71' can be interposed between the screen pattern 72' and the tunnel dielectric layer 65. The first floating gate patterns 71D' in which impurities are implanted can be extended on the first floating gate pattern 71'. In other words, the first floating gate patterns 71D' in which impurities are implanted can be formed such that the first floating gate patterns 71D' in which impurities are implanted and sidewalls of the second floating gate pattern 73D' in which impurities are implanted face each other.

Top surfaces of the first floating gate patterns 71D' in which impurities are implanted and the second floating gate pattern 73D' in which impurities are implanted can be formed to be substantially disposed on the same plane. The screen pattern 72' can be interposed between the first floating gate patterns 71D' in which impurities are implanted and the second floating gate pattern 73D' in which impurities are implanted, or between the first floating gate pattern 71' and the second floating gate pattern 73D' in which impurities are implanted. The gate line 83' can partially cover the sidewalls of the first floating gate patterns 71D' in which impurities are implanted.

The first floating gate patterns 71D' in which impurities are implanted and the second floating gate pattern 73D' in which impurities are implanted can be formed of a polysilicon layer in which impurity ions are implanted. The impurity ions can be of a type selected from a group consisting of Boron, Phosphorus, Arsenic and Germanium. The first floating gate pattern 71' can be an undoped polysilicon layer.

Concentration distribution of the impurity ions can get lower from the top surface of the floating gates 75F downward. Specifically, the second floating gate pattern 73D' in which impurities are implanted can have a relatively higher concentration of impurity ions than the first floating gate patterns 71D' in which impurities are implanted. Further, the first floating gate patterns 71D' in which impurities are implanted can a have relatively higher concentration of impurity ions than the first floating gate layer 71. The screen pattern 72' can act to interrupt the impurity ions from expanding. Thus, the first floating gate pattern 71' adjacent to the tunnel dielectric layer 65 may not have the impurity ions or may have a relatively low concentration impurity ions.

The first floating gate pattern 71' and the first floating gate patterns 71D' in which impurities are implanted can be formed to have a thickness in a range of about 5 to 40 nm. The screen pattern 72' can be formed to have a thickness in a range of about 0.1 to 3 nm, more preferably to have a thickness in a range of about 1 to 2 nm. The screen pattern 72' can be formed of one layer selected from a group consisting of a silicon oxide layer, a silicon nitride layer, a silicon oxy-nitride layer, and a combination thereof.

Source/drain regions 52S and 52D can be provided in the active region 52 adjacent to both sides of the gate line 83'.

As illustrated above, according to exemplary embodiments of the present invention, as the floating gates 75F gets nearer to the tunnel dielectric layer 65 the impurity ion concentration can decrease. Further, as the floating gates 75F get nearer to the intergate dielectric pattern 81', the impurity ion concentration can increase. The impurity ions can act to increase the conductivity of the floating gates 75F. Further, the first floating gate pattern 71' adjacent to the tunnel dielectric layer 65 may not have the impurity ions or may have a relatively low concentration impurity ions.

Furthermore, the gate line 83' can cover the sidewalls of the first floating gate patterns 71D' in which impurities are implanted. The first floating gate patterns 71D' in which impurities are implanted can have the impurity ions having higher concentration than the first floating gate pattern 71'. In other words, the first floating gate patterns 71D' in which impurities are implanted can have superior conductivity characteristics. Thus, a coupling ratio between the gate line 83', the floating gates 75F, and the active regions 52 can be increased.

In conclusion, a flash memory device can be implemented which has superior electrical characteristics and higher reliability, for example.

Exemplary embodiments in accordance with aspects of the present invention have been disclosed herein and, although specific terms are employed, they are used and are to be interpreted in a generic and descriptive sense only and not for purpose of limitation. Accordingly, it will be understood by those of ordinary skill in the art that various changes in form and details can be made without departing from the spirit and scope of the present invention as set forth in the following claims. For example, the present invention can be applied to another semiconductor device including, but not limited to, a MOS field effect transistor (MOSFET) and a method of fabricating the same.

What is claimed is:

1. A method of forming a non-volatile memory device comprising:
    forming isolation patterns to define an active region on a substrate;
    forming a floating gate pattern self-aligned on the active region; and
    forming a gate line on the floating gate pattern, wherein the floating gate pattern contains impurity ions having a concentration that decreases as the floating gate pattern gets nearer to the active region, wherein the isolation patterns are formed to protrude upwardly from the active region, and
    wherein the forming of the floating gate pattern comprises:
        forming a first floating gate layer covering the isolation patterns and the active region;
        forming a screen layer on the first floating gate layer;
        forming a second floating gate layer on the screen layer; and
        planarizing the second floating gate layer, the screen layer, and the first floating gate layer until the isolation patterns are exposed.

2. The method according to claim 1, wherein the planarized first floating gate layer is formed to wrap sidewalls and a bottom of the second floating gate layer.

3. The method according to claim 1, wherein the first floating gate layer is formed of an undoped polysilicon layer.

4. The method according to claim 1, wherein the first floating gate layer is formed to have a thickness in a range of about 5 to 40 nm.

5. The method according to claim 1, wherein the screen layer is formed to have a thickness in a range of about 0.1 to 3 nm.

6. The method according to claim 1, wherein the screen layer is formed of at least one layer selected from a group consisting of a silicon oxide layer, a silicon nitride layer, a silicon oxy-nitride layer, and a combination thereof.

7. The method according to claim 1, wherein the screen layer is formed by a plasma nitridation, a radical oxidation, or a thermal oxidation process.

8. The method according to claim 1, wherein the second floating gate layer is formed of an undoped polysilicon layer or a doped polysilicon layer that includes at least some of the impurity ions implanted therein.

9. The method according to claim 1, further comprising implanting the impurity ions into the second floating gate layer and the first floating gate layer, after planarizing the second floating gate layer, the screen layer, and the first floating gate layer.

10. The method according to claim 9, wherein the impurity ions are not implanted into a portion of the first floating gate layer adjacent to the active region.

11. The method according to claim 1, wherein forming the isolation patterns comprises:

forming a hard mask pattern on the substrate;

forming isolation trenches defining the active region on the substrate by using the hard mask pattern as an etching mask;

forming an insulation layer filling the isolation trenches and covering the hard mask pattern;

exposing the hard mask pattern by planarizing the insulating layer; and forming a gate trench and the isolation patterns by removing the hard mask pattern.

12. The method according to claim 11, further comprising etching the isolation patterns to enlarge the gate trench, after removing the hard mask pattern.

13. The method according to claim 1, wherein the impurity ions are ions selected from a group consisting of Boron, Phosphorus, Arsenic, and Germanium.

14. The method according to claim 1, wherein forming the gate line comprises:

forming a gate conducting layer covering the floating gate pattern and the isolation patterns; and patterning the gate conducting layer.

15. The method according to claim 14, further comprising exposing sidewalls of the floating gate pattern by etching the isolation patterns before forming the gate conducting layer.

16. The method according to claim 14, wherein the gate line covers the sidewalls and a top surface of the floating gate pattern and is formed at a higher level than a bottom surface of the floating gate pattern.

* * * * *